United States Patent [19]

Krachanko

[11] Patent Number: 4,814,700

[45] Date of Patent: Mar. 21, 1989

[54] FIELD CURRENT MEASUREMENT DEVICE

[75] Inventor: Allen Krachanko, Allegheny Township, Westmoreland County, Pa.

[73] Assignee: Westinghouse Electric Corp., Pittsburgh, Pa.

[21] Appl. No.: 111,962

[22] Filed: Oct. 23, 1987

[51] Int. Cl.$^4$ .................. G01R 31/02; G01R 1/20
[52] U.S. Cl. .................. 324/158 MG; 322/99; 324/127
[58] Field of Search .............. 324/158 MG, 545, 127, 324/173; 322/99

[56] References Cited

U.S. PATENT DOCUMENTS 3,404,339  10/1968  Mitchell ........................ 324/173
3,593,123  7/1971   Williamson et al. ............. 322/99
3,624,504  11/1971  Joly ........................... 324/158 MG

FOREIGN PATENT DOCUMENTS 1288679  2/1969  Fed. Rep. of Germany ...... 324/158 MG Primary Examiner—Ernest F. Karlsen

[57] ABSTRACT

A rotating machine including a generator having a rotor provided with a field winding, an exciter having an armature, a rotatable steel shaft connected to the generator rotor and the exciter armature, and current conductors enclosed by, and extending axially along, the shaft for conducting a dc generator excitation current from the exciter to the generator rotor field winding, which current creates a magnetic field with the shaft, the machine being provided with a member defining a stationary magnetic field path external to the shaft and magnetically coupled to the shaft for conducting a predetermined portion of the magnetic field created in the shaft, the path being disposed such that during rotation of the shaft, the intensity of the magnetic field in the path varies cyclically; and a magnetic field responsive component magnetically coupled to the path for producing an output signal respresentative of the rate of change of the magnetic field in the path.

8 Claims, 1 Drawing Sheet

FIELD CURRENT MEASUREMENT DEVICE

BACKGROUND OF THE INVENTION

The present invention is concerned with measuring the field current being conducted from an exciter to a generator via a pair of axial leads extending along the center of a shaft coupled to the generator and the exciter.

It is known to associate a wound rotor generator with an exciter which supplies a dc field current to the generator rotor via a pair of axial leads extending along the center of a shaft which is common to the exciter and the generator. It is desirable to be able to measure this field current in connection with monitoring generator performance, testing of generator transient response, detection of field winding shorts and diagnosis of excitation system malfunctions. However, in the case of certain types of generators, such as those having a brushless excitation system, the generator rotor field winding current cannot be measured directly.

SUMMARY OF THE INVENTION

It is an object of the present invention to measure such field current without requiring any structural modification of the exciter, the generator, or the shaft.

Another object of the invention is effect such field current measurement in a simple and inexpensive manner.

Yet another object of the invention is to effect such measurement by means of a structurally simple, passive device.

The above and other objects are achieved, according to the present invention, in a rotating machine including a generator having a rotor provided with a field winding, an exciter having an armature, a rotatable steel shaft connected to the generator rotor and the exciter armature, and current conductors enclosed by, and extending axially along, the shaft for conducting a dc generator excitation current from the exciter to the generator rotor field winding, which current creates a magnetic field within the shaft, by the provision of: means defining a stationary magnetic field path external to the shaft and magnetically coupled to the shaft for conducting a predetermined portion of the magnetic field created in the shaft, the path being disposed such that during rotation of the shaft, the intensity of the magnetic field in the path varies cyclically; and magnetic field responsive means magnetically coupled to the path for producing an output signal representative of the rate of change of the magnetic field in the path.

DESCRIPTION OF THE PREFERRED EMBODIMENTS

Figure 1:
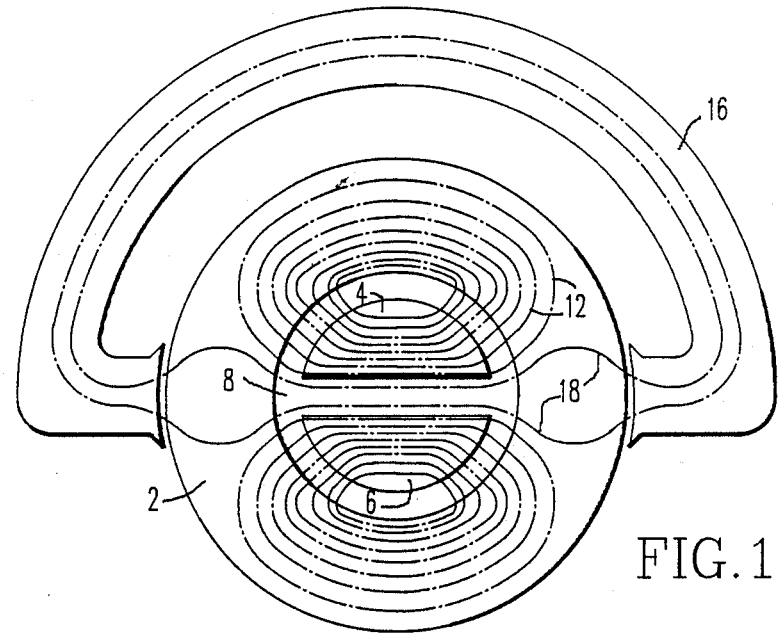
FIG. 1 is a pictorial view illustrating a shaft associated with a C-shaped core, along with the magnetic flux lines which will exist when a current is being conducted along the center of the shaft.

FIG. 1 illustrates a shaft 2 which extends between a wound rotor generator and a brushless exciter and which is secured to the generator rotor and the exciter armature. At the center of shaft 2, there are disposed, as is known, two axial conductors 4 and 6 which are insulated from each other and from shaft 2 by a body of insulation 8.

When a dc current flows through conductors 4 and 6, there will be established a static magnetic field having the form represented by the closed flux lines 1 shown to be located totally within shaft 2. Since shaft 2 is made of steel having a much larger permeability than that of the surrounding air, most of this magnetic field will be confined within the shaft. The density of this magnetic field is relatively low, so that the permeability of the shaft steel will not vary with changes in the magnetic field. As a result, the intensity of this magnetic field is directly proportional to the magnitude of the field current flowing through conductors 4 and 6. Since conductors 4 and 6 rotate as a unit with shaft 2, the magnetic field will also rotate with the shaft, i.e. will be stationary relative to the shaft.

If, now, a high permeability magnetic path is provided outside of the shaft, with the ends of such path being in proximity to the shaft surface, a portion of the magnetic field will be diverted to flow along that path. By way of example, as shown in the drawing, this path is provided by a C-shaped member 16 composed of a high permeability steel of the type customarily employed for transformer cores. The ends of member 16 face the periphery of shaft 2 and form a small air gap therewith. With member 16 in the position shown in the drawing, a portion 18 of the magnetic field in shaft 2 will be diverted to flow along the path defined by member 16.

When member 16 is held stationary, and shaft 2 rotates, the magnetic field in member 16 will vary in magnitude at a frequency equal to the speed of rotation of shaft 2. The peak-to-peak variation of this magnetic field variation will be proportional to the intensity of the magnetic field in shaft 2 and thus to the magnitude of the field current flowing through conductors 4 and 6.

Figure 2:
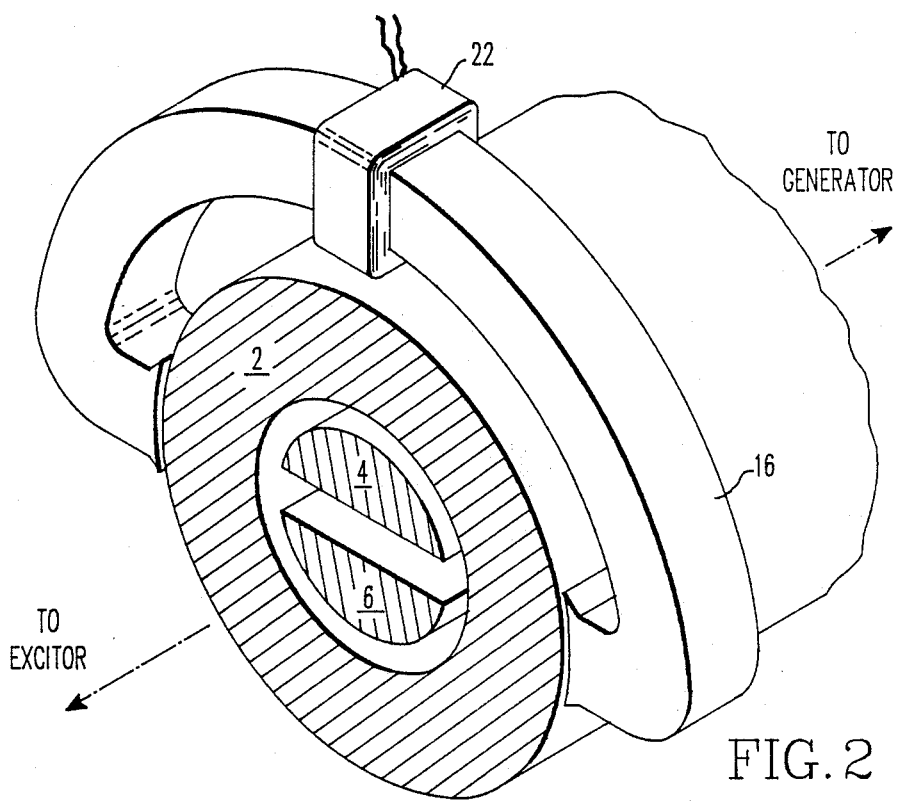
FIG. 2 is a perspective, cross-sectional view showing the arrangement of FIG. 1 with the insulation surrounding the conductors at the center of the shaft eliminated to facilitate illustration.

In order to monitor the current flowing through conductors 4 and 6, a series-wound coil 22 is formed around member 16, as shown in FIG. 2. The time-varying magnetic field within member 16 will induce a voltage in coil 2 and, for a given shaft speed, this voltage will be directly proportional to the intensity of the magnetic field in member 16 and, as a result, directly proportional to the current flowing through conductors 4 and 6. Therefore, the voltage induced in coil 22 can be calibrated to provide a direct measurement of the field current amplitude.

Preferably, member 16 is formed so that its free ends, which are spaced a small distance from the periphery of shaft 2, are located adjacent diametrically opposite points on shaft 2. Member 16 can be made of any suitable high permeability material. For example, member 16 can be made of high permeability oriented steel laminations or a high permeability ferrite material. When member 16 is composed of laminations, their major surfaces will be perpendicular to the axis of shaft 2. The spacing between the free ends of member 16 and the periphery of shaft 2 is selected to provide a sufficient magnetic coupling between shaft and member 16, while assuring that the free ends of member 16 will remain out of contact with the shaft periphery.

In general, and as is known, the magnitude of the voltage induced in coil 22 for a given field current magnitude will be inversely proportional to the length of the air gaps between member 16 and the periphery of shaft 2 and directly proportional to the number of winding turns in coil 22.

One exemplary embodiment of the present invention could have the following dimensions, which have been determined by calculation, for the case of a small generator where shaft 2 has an outer diameter of the order of 15 cm and a bore diameter of the order of 7.5 cm, the bore enclosing insulation 8 and conductors 4 and 6. For this example, it is assumed that the full load field current of the generator is 600 A. For this example, member 16 could have the form shown in FIGS. 1 and 2, with a dimension parallel to the axis of shaft of the order of 2.5 cm and a dimension in the radial direction of shaft 2 of the order of 5 cm. The radial air gap between each free end of member 16 and the peripheral surface of shaft 2 can be selected to have a value of the order of 0.16 cm. If coil 22 is composed of 1000 turns, the peak voltage induced therein would be of the order of 160 mV. Of course, these dimensions and the precise shape of member 16 can be varied without departing from the concept of the invention.

It will be understood that the above description of the present invention is susceptible to various modifications, changes, and adaptations, and the same are intended to be comprehended within the meaning and range of equivalents of the appended claims.

What is claimed is:

1. In a rotating machine including a generator having a rotor provided with a field winding, an exciter having an armature, a rotatable steel shaft connected to the generator rotor and the exciter armature, and current conductors enclosed by, and extending axially along, the shaft for conducting a dc generator excitation current from the exciter to the generator rotor field winding, which current creates a magnetic field within the shaft, the improvement comprising: means defining a stationary magnetic field path external to said shaft and magnetically coupled to said shaft for conducting a predetermined portion of the magnetic field created in said shaft, said path being disposed such that during rotation of said shaft, the intensity of the magnetic field in said path varies cyclically; and magnetic field responsive means magnetically coupled to said path for producing an output signal representative of the rate of change of the magnetic field in said path.

2. A machine as defined in claim 1 wherein said means defining a stationary magnetic field path comprise a body of high permeability magnetic material having a C-shape.

3. A machine as defined in claim 2 wherein said body has two end portions facing, and spaced radially from, said shaft.

4. A machine as defined in claim 3 wherein said end portions of said body are disposed opposite diametrically opposed regions of the surface of said shaft.

5. A machine as defined in claim 2 wherein said body comprises a plurality of oriented steel laminations.

6. A machine as defined in claim 2 wherein said body is made of a ferrite material.

7. A machine as defined in claim 2 wherein said magnetic field responsive means comprise a series-wound coil wound around said body, said coil having two end leads between which there appears a voltage proportional to the excitation current carried by said conductors when said shaft is rotating at a selected speed.

8. A machine as defined in claim 2 wherein said body is oriented perpendicularly to the axis of rotation of said shaft.

* * * * *